United States Patent [19]
Chen et al.

[11] Patent Number: 6,020,259
[45] Date of Patent: Feb. 1, 2000

[54] METHOD OF FORMING A TUNGSTEN-PLUG CONTACT FOR A SEMICONDUCTOR DEVICE

[75] Inventors: Hsi-Chieh Chen; Guan-Jiun Yi; Wen-Cheng Tu; Kuo-Lun Tseng, all of Hsinchu, Taiwan

[73] Assignee: Mosel Vitelic, Inc., Hsinchu, Taiwan

[21] Appl. No.: 08/846,471

[22] Filed: May 1, 1997

[51] Int. Cl.⁷ .................................................. H01L 21/441
[52] U.S. Cl. ........................ 438/648; 438/680; 438/655; 438/656
[58] Field of Search ..................... 438/648, 655, 438/656, 682, 683, 680

[56] References Cited

U.S. PATENT DOCUMENTS 5,240,739   8/1993   Doan et al. .
5,525,543   6/1996   Chen .
5,595,784   1/1997   Kaim et al. .
5,831,335   11/1998   Miyamoto ................................. 257/757

OTHER PUBLICATIONS

D. Maury, et al. "Selective Titanium Silicide for Industrial Applications" Silicide Thin Films–Symposium Mater. Res. Soc. pp. 283–294, 1996.

R.C. Ellwanger, et al. "An Integrated Aluminum/CVD–W Metallization Process for Sub–Micron Contact Filling" Proc. 8th International IEEE VLSI Multilevel Interconnect Conf. (Santa Clara, Calif.) pp. 41–50, Jun. 1991.

*Primary Examiner*—Caridad Everhart
*Attorney, Agent, or Firm*—Harness, Dickey & Pierce, P.L.C.

[57] ABSTRACT

A method for forming a tungsten plug is disclosed herein. A $TiSi_2$ layer is selectively formed in a contact hole by using chemical vapor deposition. Then, a TiN layer is formed on the surface of the contact hole and on the $TiSi_2$ layer. Next, a tungsten layer is formed on the TiN layer and in the contact hole. A CMP is used to remove a portion of the tungsten layer and TiN layer for planarization.

10 Claims, 4 Drawing Sheets ue
6,020,259

METHOD OF FORMING A TUNGSTEN-PLUG CONTACT FOR A SEMICONDUCTOR DEVICE

FIELD OF THE INVENTION

The present invention relates to a method of forming a contact for integrated circuit (IC), and more specifically, to a method of forming a W-plug contact by using chemical mechanical polishing (CMP) and selective $TiSi_2$ chemical vapor deposition (CVD) process.

BACKGROUND OF THE INVENTION

To manufacture electric circuits involves the formation of interconnection between devices. Thus, to fabricate ICs, interconnections and contacts from one another must be formed on the silicon substrate for electrical signal connection. The technology used to connect these isolated devices through specific electrical paths employs high conductivity, thin film structure. Therefore, a connection is needed between a conductor layer and the silicon substrate. A hole in an isolation layer must be provided to allow such contact to occur.

Up to now, many of contact technologies have been proposed. One of the most widely used materials for filling the hole is tungsten (W). W-plug is used primarily for connection between isolated devices in VLSI and ULSI. A conventional method to form the W-plug will be described as follows.

Turning to FIG. 1, a silicon substrate 2 is provided, then an isolation layer 4 is deposited on the substrate 2 for isolation. Next, a contact hole 6 is created in the isolation layer 4 by using patterning and etching processes. A titanium layer 8 is subsequently deposited on the isolation layer 4 and on the surface of the contact hole 6 using physical vapor deposition (PVD). The thickness of the titanium layer 8 is about 1000 angstroms. Such thickness of the titanium layer 8 is necessary due to the bad step coverage of the PVD process.

Referring to FIG. 2, the titanium layer 8 is then treated by rapid thermal annealing (RTA) in nitrogen ambient environment to form the TiN layer 10. The TiN layer 10 serves as the barrier for subsequent process. Further, a $TiSi_2$ layer 12 will be simultaneously formed on the interface between the silicon substrate 2 and the titanium layer 8. The $TiSi_2$ layer 12 is used to reduce the resistance of the contact.

Turning to FIG. 3, a tungsten layer 14 is formed by CVD on the TiN layer 10 and refilled into the contact hole 6. Next, a CMP is utilized to polish the tungsten layer 14 for planarization Unfortunately, the conventional process needs long polish time to remove the thick TiN layer 10 and the titanium 8. However, the long polish time for planarization may cause the erosion effect. Further, it also raises the cost of the CMP for removing the tungsten layer 14 in the conventional method. Additionally, the PVD titanium deposition process can not achieve high aspect ratio contact in half submicron devices.

SUMMARY OF THE INVENTION

An isolation layer is deposited on a substrate for isolation. Next, a contact hole is generated by patterning and etching processes. A $TiSi_2$ layer is selectively deposited in the contact hole on the substrate 2 using $TiCl_4$ as reaction material using chemical vapor deposition. The temperature of the chemical vapor deposition is about 600–700° C. Subsequently, a blanket chemical vapor deposition is carried out in nitrogen ambient environment to formed a TiN layer on the isolation layer, on the sidewall of the contact hole and on the $TiSi_2$ layer. A tungsten layer is formed by CVD on the TiN layer and refilled into the contact hole. Next, a CMP is performed to polish the tungsten layer to the surface of the isolation layer for planarization. A tungsten plug is thus formed in the contact hole

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

A method is disclose to form a W-plug by using selective $TiSi_2$ CVD process, TiN CVD process and chemical mechanical polishing (CMP). The present invention not only reduces the thickness of the TiN layer but also solves the erosion problem.

Figure 1:
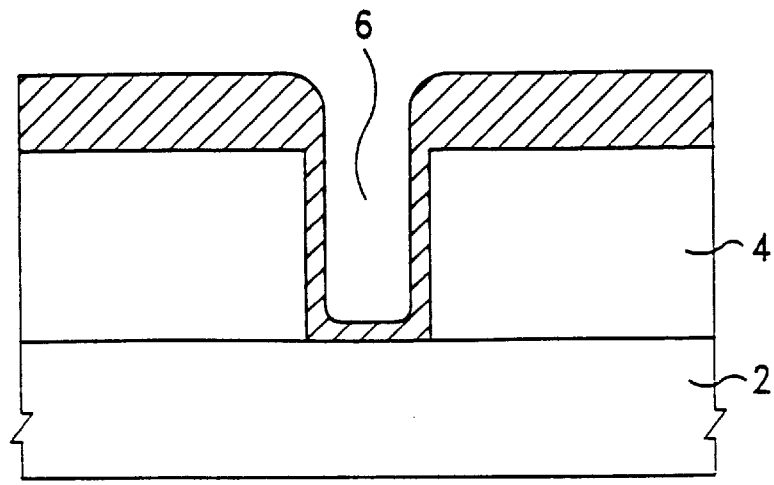
FIG. 1 is a cross section view of a semiconductor wafer illustrating the step of forming an isolation layer on a substrate, forming a contact hole in the isolation layer and forming a tungsten layer in the contact hole in accordance with prior art.
Figure 2:
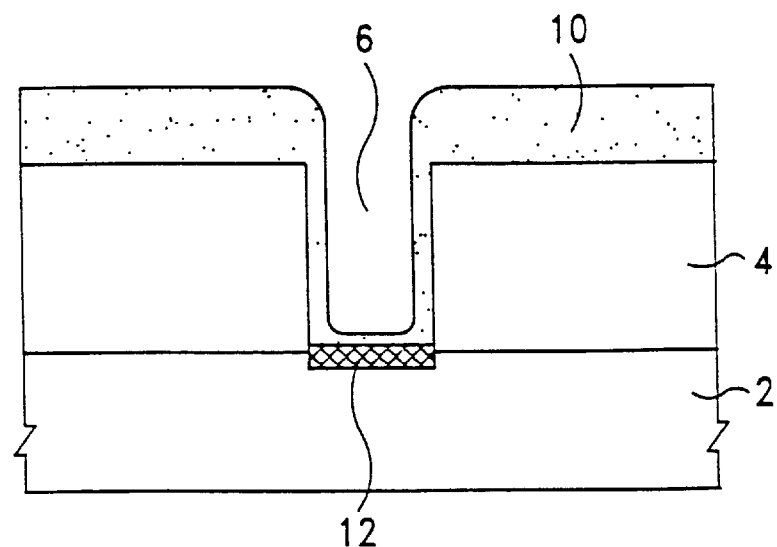
FIG. 2 is a cross section view of a semiconductor wafer illustrating the step of forming TiN layer and $TiSi_2$ layer over the substrate in accordance with prior art.
Figure 3:
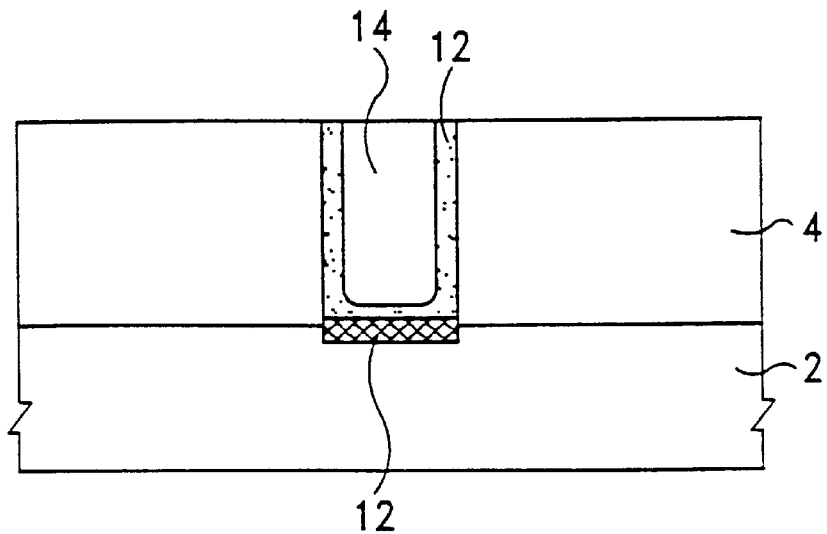
FIG. 3 is a cross section view of a semiconductor wafer illustrating the step of forming a tungsten plug in the contact hole in accordance with prior art.
Figure 4:
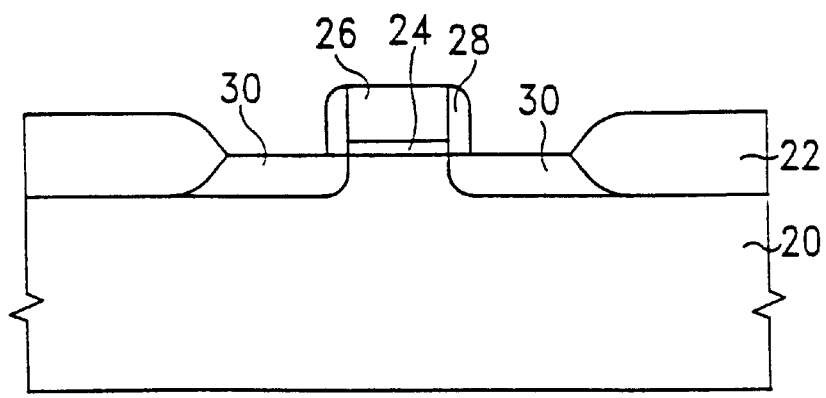
FIG. 4 is a cross section view of a semiconductor wafer illustrating the step of forming a transistor on a substrate in accordance with prior art.

Referring to FIG. 4, in the preferred embodiment a silicon substrate 20 is p type silicon with <100 >crystallographic orientation. A semiconductor device, for example, a transistor can be formed on the substrate 20. The formation of the device is described as follows. A thick field oxide (FOX) region 22 is formed to provide isolation between devices on the substrate 20. The FOX region 22 is created in a conventional manner. Next, a silicon dioxide layer 24 is created on the top surface of the substrate 20 to serve as the gate oxide for isolation. A doped polysilicon layer 26 is then formed over the FOX region 22 and the silicon dioxide layer 24 using a Low Pressure Chemical Vapor Deposition (LPCVD) process. Next, a photolithography and an etching steps are used to form a gate structure. Sidewall spacers 28 are subsequently formed on the sidewalls of the gate structure. Then, an ion implantation is used to form the source/drain 30 of the device.

Figure 5:
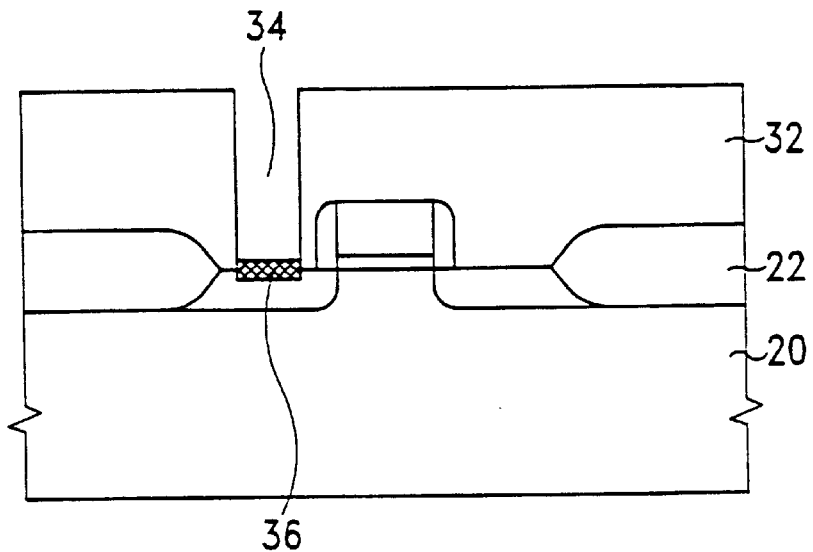
FIG. 5 is a cross section view of a semiconductor wafer illustrating the step of forming an isolation layer on the substrate, forming a contact hole in the isolation layer and forming a $TiSi_2$ layer in the contact hole in accordance with the present invention.

Turning to FIG. 5, an isolation layer 32 such as BPSG or silicon oxide is deposited on the substrate 20 for isolation. Next, a photoresist is patterned on the isolation layer 32 to define the contact hole region. Subsequently, an etching process is performed by using the photoresist as an etching mask to etch the isolation layer to the surface of the substrate. A contact hole 34 is generated by the etching processes. Then, the photoresist is stripped away. A TiSi$_2$ layer 36 is selectively deposited in the contact hole 34 on the substrate 2 by using chemical vapor deposition (CVD). The reaction of the step is described as follows.

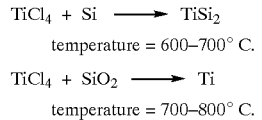

$$TiCl_4 + Si \longrightarrow TiSi_2$$
$$\text{temperature} = 600\text{–}700° C.$$
$$TiCl_4 + SiO_2 \longrightarrow Ti$$
$$\text{temperature} = 700\text{–}800° C.$$

Thus, the TiSi$_2$ layer 36 can be selectively deposition at the contact region using TiCl$_4$ as reaction material by controlling the reaction temperature and pressure. Preferably, the temperature of the chemical vapor deposition is about 600–900° C. The pressure of the deposition is at the range of 5 to 100 torr. The TiSi$_2$ layer 36 is used to improve the conductivity of the contact.

Figure 6:
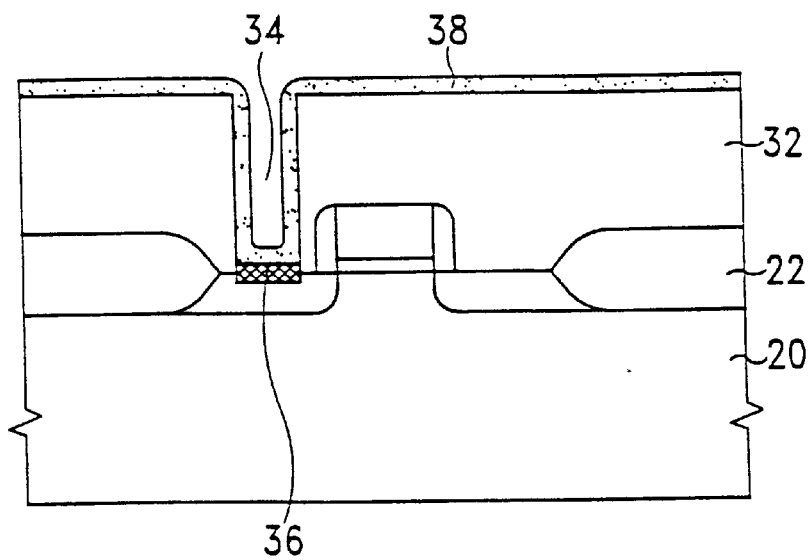
FIG. 6 is a cross section view of a semiconductor wafer illustrating the step of forming a TiN layer on the isolation layer, in the contact hole and on the $TiSi_2$ layer in accordance with the present invention.

As shown in FIG. 6, subsequently, a blanket chemical vapor deposition is carried out in nitrogen ambient environment to formed a TiN layer 38 on the isolation layer 32, on the sidewall of the contact hole 34 and on the TiSi$_2$ layer 36. The reaction is: TiCl$_4$+N$_2$→TiN, at a temperature about 600–900° C. The TiN layer 38 acts as a barrier to prevent WF$_6$ gas from reacting with underlying layer TiSi$_2$. In addition, the TiN layer 38 is also used for tungsten nucleation. The thickness of the TiN layer 38 is about 50–100 angstroms. In the present invention, the thickness of the TiN layer 38 is thinner than the one of the conventional method.

Figure 7:
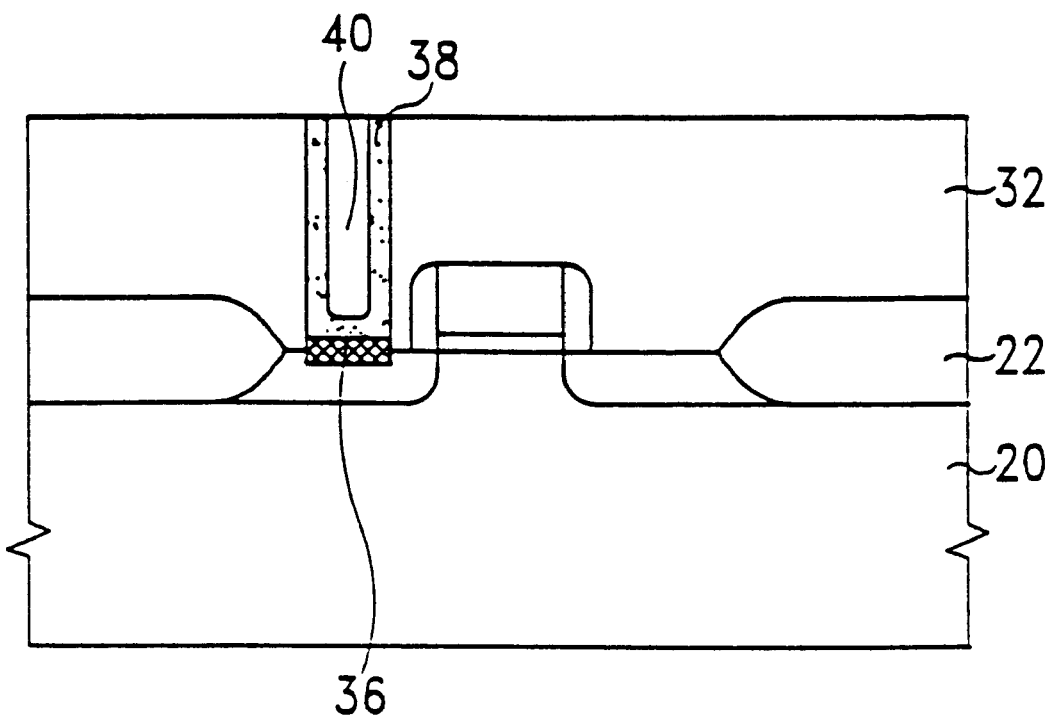
FIG. 7 is a cross section view of a semiconductor wafer illustrating the step of forming a tungsten plug in the contact hole in accordance with the present invention.

Turning to FIG. 7, a tungsten layer 40 is formed by CVD on the TiN layer 38 and refilled into the contact hole 34. The thickness of the tungsten layer 40 from the surface of the TiN layer 38 is about 6000 angstroms. Next, a CMP is performed to polish the tungsten layer 40 to the surface of the isolation layer 32 for planarization. The polishing selectivity of the tungsten to TiN is about 2–4:1. Thus, a tungsten plug 40 is formed in the contact hole 34.

The present invention provides a thinner TiN layer process to reduce the time for CMP polish. Therefore, the cost of the process is degraded and the throughput is increased. Further, the erosion problem that generated by long polish time is eliminated by the present invention.

As is understood by a person skilled in the art, the foregoing preferred embodiment of the present invention is illustrated of the present invention rather than limiting of the present invention. It is intended to cover various modifications and similar arrangements included within the spirit and scope of the appended claims, the scope of which should be accorded the broadest interpretation so as to encompass all such modifications and similar structure.

While the preferred embodiment of the invention has been illustrated and described, it will be appreciated that various changes can be made therein without departing from the spirit and scope of the invention.

The embodiments of the invention in which an exclusive property or privilege is claimed are defined as follows:

1. A method of forming an electrical contact on a semiconductor wafer, said method comprising:
   forming an isolation layer on said wafer;
   forming a contact hole in said isolation layer, said contact hole exposing a portion of said wafer;
   selectively forming a TiSi$_2$ layer in said contact hole on said exposed wafer by using chemical vapor deposition and by controlling a deposition temperature, the reaction material being TiCl$_4$, wherein said reaction material (TiCl$_4$) reacts with said exposed wafer thereby forming said TiSi$_2$ wherein said TiSi$_2$ layer is selectively formed at said deposition temperature in the range of about 600° C. to 700° C.;
   forming a TiN layer on said isolation layer, on the surface of said contact hole and on the TiSi$_2$ layer by using chemical vapor deposition in nitrogen ambient environment, the reaction material being TiCl$_4$;
   forming a tungsten layer on said TiN layer and in said contact hole; and
   planarizing said tungsten layer and said TiN layer to the surface of said isolation layer by using chemical mechanical polishing.

2. The method of claim 1, further comprising the following steps to form said contact hole:
   patterning a photoresist on said isolation layer to define said contact hole region;
   etching said isolation layer to said substrate by using said photoresist as a mask; and
   removing said photoresist.

3. The method of claim 1, wherein the pressure of forming said TiSi$_2$ layer is about 5 to 100 torr.

4. A method of forming an electrical contact on a semiconductor wafer, said method comprising:
   forming an isolation layer on said wafer;
   forming a contact hole in said isolation layer, said contact hole exposing a portion of said wafer;
   selectively forming a TiSi$_2$ layer in said contact hole on said exposed wafer by using chemical vapor deposition and by controlling a deposition temperature, the reaction material being TiCl$_1$, wherein said reaction material (TiCl$_1$) reacts with said exposed wafer thereby forming said TiSi$_2$,
   forming a TiN layer on said isolation layer, on the surface of said contact hole and on the TiSi$_2$ layer by using chemical vapor deposition in nitrogen ambient environment, the reaction material being TiCl$_4$, wherein said TiN layer is formed at a temperature in the range of about 600° C. to 900° C.,
   forming a tungsten layer on said TiN layer and in said contact hole, and
   planarizing said tungsten layer and said TiN layer to the surface of said isolation layer by using chemical mechanical polishing.

5. The method of claim 4, wherein the thickness of said TiN layer is about 50 to 200 angstroms.

6. The method of claim 1, where in the thickness of said TiN layer is about 50 to 200 angstroms.

7. The method of claim 1, wherein said TiN layer is formed at a temperature in the range of about 600° C. to 900° C.

8. The method of claim 4, further comprising the following steps to form said contact hole:
   patterning a photoresist on said isolation layer to define said contact hole region;
   etching said isolation layer to said substrate by using said photoresist as a mask; and
   removing said photoresist.

9. The method of claim 4, wherein said TiSi$_2$ layer is selectively formed at said deposition temperature in the range of about 600° C. to 900° C.

10. The method of claim 5, wherein the pressure of forming said TiSi$_2$ layer is about 5 to 100 torr.

* * * * *